United States Patent
Yamamoto (10) Patent No.: US 6,716,295 B2
(45) Date of Patent: Apr. 6, 2004

(54) PROTECTIVE TAPE APPLYING AND SEPARATING METHOD

(75) Inventor: Masayuki Yamamoto, Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 10/314,276

(22) Filed: Dec. 9, 2002

(65) Prior Publication Data

US 2003/0121599 A1 Jul. 3, 2003

(30) Foreign Application Priority Data

Dec. 27, 2001 (JP) .......................... 2001-396919

(51) Int. Cl.[7] .......................... B32B 31/28; B32B 33/00; B32B 35/00; H01L 21/423
(52) U.S. Cl. ................. 156/247; 156/272.2; 156/273.5; 156/344; 438/464
(58) Field of Search .................. 156/247, 248, 156/272.2, 273.5, 344; 438/464

(56) References Cited

U.S. PATENT DOCUMENTS 5,981,391 A * 11/1999 Yamada ....................... 438/690

FOREIGN PATENT DOCUMENTS

JP          2000-331968 A1    11/2000

* cited by examiner

Primary Examiner—Richard Crispino
Assistant Examiner—Sing P. Chan
(74) Attorney, Agent, or Firm—Rader, Fishman & Grauer PLLC (57) ABSTRACT

A protective tape is applied by a tape applying mechanism to a surface of a wafer suction-supported by a chuck table. The protective tape is cut to the shape of the wafer by a cutter unit. Then, a protective tape having stronger adhesion than the first protective tape is applied over the protective tape. The protective tapes in plies are separated together from the surface of the wafer in one separating operation of a tape separating device.

16 Claims, 6 Drawing Sheets

PROTECTIVE TAPE APPLYING AND SEPARATING METHOD

BACKGROUND OF THE INVENTION (1) Field of the Invention

This invention relates to a technique for applying protective tape to a wafer surface with a pattern formed thereon and for separating the protective tape.

(2) Description of the Related Art

In a conventional process of manufacturing semiconductor wafers, a mechanical method such as grinding or polishing, or a chemical method including etching, is used to process the back surfaces of semiconductor wafers (hereinafter simply called "wafers") to reduce the thickness thereof. When these methods are used to process the wafers, a protective tape is applied to the front surfaces of wafers in order to protect the front surfaces having wiring patterns formed thereon.

When a wafer is sent to a back-grinding process, the front surface (patterned surface) is suction-supported by a chuck table and the back surface is ground with a grinder. At this time, a protective tape is applied to the front surface to avoid the pattern being damaged under the stress of grinding occurring to the front surface, and to avoid contamination of the pattern.

The wafer thinned by grinding of its back surface could easily be broken during the processing or transportation. The wafer, due to its deflection or bending, is difficult to handle. In order to avoid such inconveniences, a proposal has been made to apply two different types of protective tape to a wafer surface beforehand to prevent damage and bending of the wafer (see Japanese Patent Publication (Unexamined) 2000-331968).

Thus, a method has been proposed and implemented to separate in a separating step, all at a time, the two types of protective tape applied to the surface of the wafer.

The use of protective tape in double plies as described in the above Japanese Patent Publication (Unexamined) 2000-331968 has an advantage in terms of wafer reinforcement, but has the following inconveniences encountered in the process of separating the protective tape.

When separating the protective tape in two plies all at once, it is sometimes impossible to separate the tapes at a time because of adhesive strengths of the first protective tape applied to the surface of the wafer and the second protective tape applied thereto. That is, the first protective could remain on the surface of the wafer.

In such a case, it is difficult to determine whether the first protective tape remains on the surface of the wafer or not.

The following problems arise when the number of protective tapes separated from the wafer cannot be recognized reliably.

When it is determined that only one protective tape is separated though the two protective tapes have been separated together, a separator tape is applied to the surface of the wafer to contaminate or damage the surface of the wafer.

Further, when a protective tape remains on the surface of the wafer, the separating step must be repeated twice, hence an inconvenience of lowering operating efficiency.

SUMMARY OF THE INVENTION

This invention has been made having regard to the state of the art noted above, and its primary object is to provide a protective tape applying and separating method capable of easily applying and separating protective tape to/from semiconductor wafers while reinforcing the wafers by giving rigidity thereto.

The above object is fulfilled, according to this invention, by a protective tape applying and separating method for applying protective tapes to a surface of a semiconductor wafer with a pattern formed thereon, and separating the protective tapes from the surface of the semiconductor wafer, the method comprising an applying step for applying a plurality of protective tapes in plies to the surface of the semiconductor wafer such that a protective tape with strong adhesion lies on top, and a separating step for applying a separator tape over the protective tapes applied in plies, and separating all at a time the protective tapes in plies from the surface of the semiconductor wafer by means of the separator tape.

With the protective tape applying and separating method according to this invention, the protective tapes are applied in plies, with a protective tape with strong adhesion lying on top, to the surface of the semiconductor wafer. Since the upper protective tape is stronger in adhesion than the lower protective tape, the lowermost protective tape, i.e. the protective tape applied directly to the surface of the semiconductor wafer, first separates from the surface of the semiconductor wafer. As a result, the protective tapes in plies are separated together from the surface of the semiconductor wafer.

Preferably, the protective tapes applied to the surface of the semiconductor wafer comprise two protective tapes bonded together in plies as a unit beforehand.

The protective tapes are applied as bonded together beforehand as a unit to the surface of the semiconductor wafer. The protective tapes applied in plies to the surface of the semiconductor wafer are separated together from the surface of the semiconductor wafer in one separating operation.

Preferably, at least an upper one of the protective tapes applied in plies is an ultraviolet curable protective tape. It is further preferable that ultraviolet light is emitted to the protective tapes applied in plies to the surface of the semiconductor wafer.

At least the upper protective tape of the protective tapes applied in plies to the surface of the semiconductor wafer is an ultraviolet curable protective tape. The adhesive of the ultraviolet curable protective tape is cured by performing an ultraviolet irradiating treatment of the protective tapes applied in plies, to adhere firmly to the surface of the lower protective tape. Thus, the protective tapes in plies are separated together from the surface of the semiconductor wafer in one separating operation.

Preferably, the lower one of the protective tapes applied in plies is an ultraviolet curable protective tape, and ultraviolet light is emitted before the protective tapes are separated from the semiconductor wafer.

Of the protective tapes applied in plies to the surface of the semiconductor wafer, an ultraviolet curable protective tape is applied directly to the surface of the semiconductor wafer. After the protective tapes are applied in plies to the surface of the semiconductor wafer, ultraviolet light is emitted before separating these protective tapes in plies, and then the protective tapes are separated. Consequently, the protective tape applied directly to the surface of the semiconductor wafer is cured to lower its adhesion, thereby facilitating separation from the semiconductor wafer.

In this invention, for example, the upper one of the protective tapes applied in plies may be a non-ultraviolet curable protective tape, or the lower one a non-ultraviolet curable protective tape.

Further, the lower protective tape of the protective tapes applied in plies has a rough surface.

Since the lower protective tape has a rough surface, the adhesive of the protective tape applied thereon enters the bulges and dimples of the surface of the lower protective tape. Thus, an area of adhesion is enlarged, and the upper protective tape adheres firmly to the lower protective tape.

Preferably, the protective tapes in plies are repeatedly applied as two separate protective tapes. Where two protective tapes are applied separately and repeatedly, for example, it is preferred that at least an upper one of the protective tapes applied in plies is an ultraviolet curable protective tape. It is further preferable that ultraviolet light is emitted to the protective tapes applied in plies to the surface of the semiconductor wafer, or the protective tapes may be bonded together and ultraviolet light emitted in a feeding step preceding application of the protective tapes to the surface of the semiconductor wafer.

The protective tapes are applied separately such that the first protective tape is applied to the surface of the semiconductor wafer, and then the second protective tape is applied to the surface of the first protective tape, and then ultraviolet light is emitted toward the protective tapes. Alternatively, ultraviolet light is emitted toward the protective tapes after the protective tapes in plies are bonded together in a feeding step preceding application of the protective tapes to the surface of the semiconductor wafer. When ultraviolet light is emitted, the adhesive of the ultraviolet curable protective tape is cured to bond the protective tapes firmly together. Thus, the protective tapes in plies are separated together from the surface of the semiconductor wafer in one separating operation.

Preferably, a lower one of the protective tapes applied in plies is an ultraviolet curable protective tape, and ultraviolet light is emitted before the protective tapes are separated from the semiconductor wafer.

Of the protective tapes applied in plies to the surface of the semiconductor wafer, an ultraviolet curable protective tape is applied directly to the surface of the semiconductor wafer. After the protective tapes are applied in plies to the surface of the semiconductor wafer, ultraviolet light is emitted before separating these protective tapes in plies, and then the protective tapes are separated. Consequently, the protective tape applied directly to the surface of the semiconductor wafer is cured to lower its adhesion, thereby facilitating separation from the semiconductor wafer.

In this invention, for example, the upper one of the protective tapes applied in plies may be a non-ultraviolet curable protective tape, or the lower one a non-ultraviolet curable protective tape.

Preferably, the lower protective tape of the protective tapes applied in plies has a rough surface.

Since the lower protective tape has a rough surface, the adhesive of the protective tape applied thereon enters the bulges and dimples of the surface of the lower protective tape. Thus, an area of adhesion is enlarged, and the upper protective tape adheres firmly to the lower protective tape.

This specification discloses the following solution also.

(1) A separating method for separating different types of ultraviolet curable protective tapes applied to a surface of a semiconductor wafer with a pattern formed thereon, the method comprising:

an ultraviolet irradiating step for emitting ultraviolet light with a wavelength varied according to the types of ultraviolet curable protective tapes; and a separating step for separating the protective tapes treated with the ultraviolet irradiation.

For example, to give rigidity to the semiconductor wafer-formed thin, different types of protective tape are applied in plies to the surface of the semiconductor wafer. The protective tapes applied in plies are to be separated from the semiconductor wafer in one separating operation. However, because of the difference in adhesion between the protective tapes, all the protective tapes may not be separated from the surface of the semiconductor wafer in one separating operation.

According to the invention (1) above, different types of ultraviolet curable protective tapes are applied in plies to the surface of the semiconductor wafer, and ultraviolet light with a wavelength varied according to the types of ultraviolet curable protective tapes is emitted individually. Each ultraviolet curable protective tape is exposed to the ultraviolet light having a different wavelength. Thus, while the mating surfaces of the protective tapes are firmly bonded by curing of the adhesive, the protective tape applied to the surface of the wafer is cured to be easily separable from the surface of the wafer. As a result, the protective tapes in plies may be separated together from the surface of the semiconductor wafer at a time in one separating operation.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

<First Embodiment>

Protective Tape Applying Method

Before describing a protective tape applying method in this invention, a tape applying apparatus used in this embodiment will be described with reference to the drawings.

Figure 1:
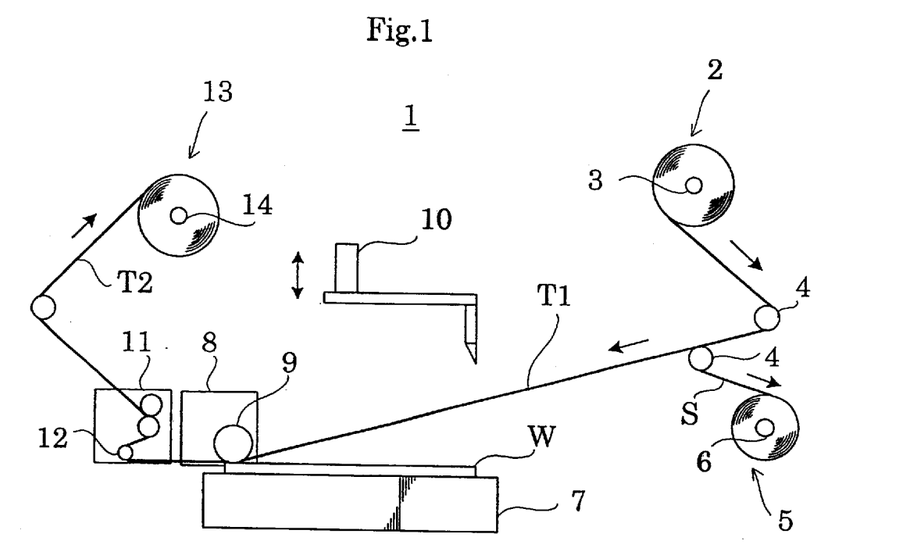
FIG. 1 is a front view showing an outline of a tape applying apparatus in a first embodiment.
Figure 2:
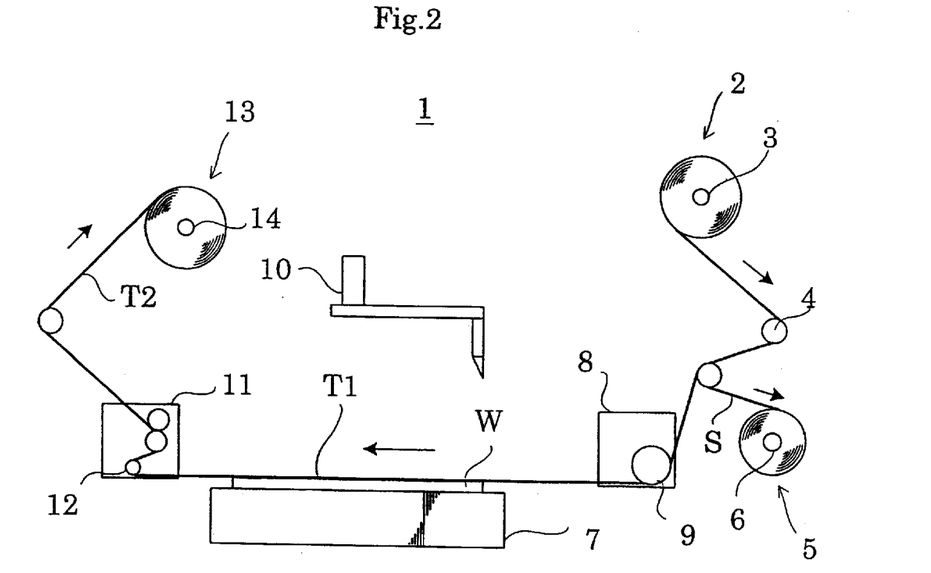
FIG. 2 is a schematic front view illustrating a tape applying process.
Figure 3:
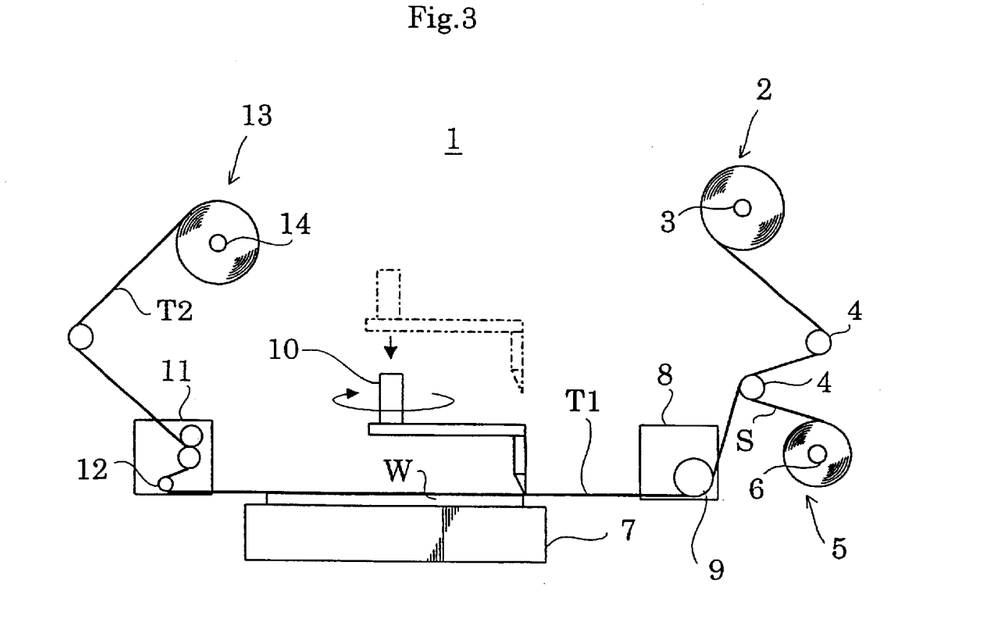
FIG. 3 is a schematic front view illustrating the tape applying process.
Figure 4:
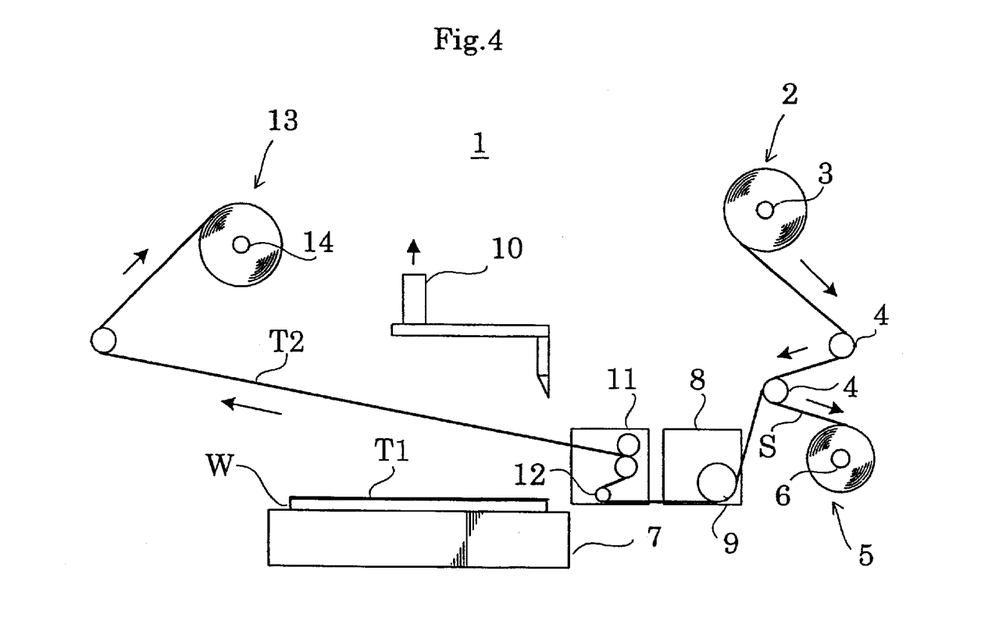
FIG. 4 is a schematic front view illustrating the tape applying process.

FIG. 1 is a front view showing an outline of a tape applying apparatus. FIGS. 2 through 4 are schematic front views illustrating a protective tape applying process.

An apparatus 1 for applying protective tape to semiconductor wafers, in this embodiment, has a tape server 2 for supplying protective tape T1 along with a separator S, a separator collector 5 for separating and collecting the separator S from the protective tape T1, a chuck table 7 for suction-supporting a semiconductor wafer W (hereinafter simply called "wafer W") thereon, a tape applying mechanism 8 for pressing and applying the protective tape T1 to the wafer W, a cutter unit 10 for cutting the protective tape T1 on the wafer W along the circumference of the wafer W, a tape separating mechanism 11 for separating residual tape T2 from the wafer W, and a tape collector 13 for collecting the separated tape.

The construction of each mechanism will be described in detail hereinafter.

The tape server 2 guides the protective tape T1 with separator S drawn from a tape bobbin 3 to move around and wind on a group of guide rollers 4. The tape bobbin 3 is supported by a vertical wall, not shown, and is checked against rotation by a braking mechanism or the like.

The separator collector 5 has a collecting bobbin 6 supported by the vertical wall not shown, and is operatively connected to a driving device such as a motor.

The chuck table 7 has guide pins for adjusting position of the wafer W placed thereon with reference to an orientation flat, while suction-supporting the wafer W at the back surface thereof.

The tape applying mechanism 8 has a frame thereof held by a rail of a main body of the apparatus and operatively connected to a driving device such as a motor not shown, to be slidable in a tape running direction. The frame rotatably supports an applicator roller 9 which is vertically swung by a cylinder or the like not shown. Thus, the applicator roller 9 applies the protective tape T1 to the surface of the wafer W while pressing and rolling on the surface of the protective tape T1.

The cutter unit 10 is vertically movable by a lift mechanism, not shown, between a standby position and a cutting position for cutting the protective tape T1. The cutter unit 10 cuts the protective tape T1 along the circumference of the wafer W.

The tape separating mechanism 11 has a frame thereof held by the rail of the main body of the apparatus and operatively connected to a driving device such as a motor not shown, to be slidable in the tape running direction. The frame rotatably supports a separator roller 12 which is vertically swung by a cylinder or the like not shown. The separator roller 12 is provided to separate from the wafer W the residual tape T2 which is left thereon after the tape is cut along the circumference of the wafer W.

The tape collector 13 has a collecting bobbin 14 supported by the vertical wall not shown, and is operatively connected to a driving device such as a motor. That is, a predetermined quantity of protective tape T1 is drawn from the tape server 2 and fed onto the wafer W. The collecting bobbin 14 is driven by the driving device to wind up the residual tape T2 left after a cutting operation.

A method of applying protective tape in a plurality of plies will be described with reference to the drawings, using the tape applying apparatus having the above construction. In this embodiment, two tape applying apparatus are used to apply two different types of protective tape in a plurality of plies to the surface of each wafer.

The two types of protective tape used in this embodiment are as follows.

The first protective tape T1 applied directly to the surface of wafer W is the non-ultraviolet curable type with a substrate having a coarse surface (rough surface). Preferably, its surface roughness is at least 100 Å (Angstrom) when the centerline surface roughness is measured with a stylus surface roughness tester.

Where the center surface roughness of the substrate surface is 100 Å or above, the adhesive of the protective tape applied thereto enters bulges and dimples of the substrate surface to enlarge an area of adhesion. That is, the protective tapes firmly adhere to each other.

Where the center surface roughness of the substrate surface is 100 Å or below, the adhesive of the protective tape applied thereto has a reduced area of adhesion. Consequently, the protective tapes adhere to each other with less strength, and only the upper, second tape could be separated in time of tape separation, leaving the first protective tape T1 on the surface of wafer W.

An ultraviolet curable type protective tape is used as the second protective tape T3.

Each of the two types of tape T1 and T3 is in roll form laminated with a separator S.

Next, a cycle of operation for applying protective tape in a plurality of plies to the wafer W by using the above two types of protective tape T1 and T3 and the tape applying apparatus 1 will be described.

A first and a second tape applying apparatus are arranged side by side. The non-ultraviolet curable protective tape T1 is set on the tape bobbin 3 of the first tape applying apparatus and the ultraviolet curable protective tape T3 is set on the tape bobbin 3 of the second tape applying apparatus.

A wafer W is placed on, positionally adjusted to and suction-supported by the chuck table 7 of the first tape applying apparatus. At this point, as shown in FIG. 1, the tape applying mechanism 8 and tape separating mechanism 11 are in an initial position at the left side, and the cutter unit 10 in the upper standby position.

After the position of the wafer W is adjusted, the applicator roller 9 of the tape applying mechanism 8 is swung downward. Then the applicator roller 9 rolls in a direction opposite to the tape running direction (from left to right in FIG. 2.) while pressing down the protective tape T1. In this way, the protective tape T1 is applied uniformly over the surface of the wafer W. When the tape applying mechanism 8 reaches a terminal position, the applicator roller 9 is raised.

Next, as shown in FIG. 3, the cutter unit 10 is lowered to the cutting position to cut the protective tape T1. The cutter unit 10 is turned to make a complete circle circumferentially of the wafer W, thereby cutting out the protective tape T1 around the wafer W.

After cutting out the protective tape T1, the cutter unit 10 is raised back to the standby position as shown in FIG. 4.

Next, as shown in FIG. 4, the tape separating mechanism 11 takes up and separates the residual tape T2 left on the wafer W while moving over the wafer W in the direction opposite to the tape running direction.

When the tape separating mechanism 11 reaches a terminal position for the separating operation, the tape separating mechanism 11 and the tape applying mechanism 8 are moved in the tape running direction back to the initial position shown in FIG. 1. In the meantime, the residual tape T2 is rolled up by the collecting bobbin 14, while a predetermined quantity of tape is drawn from the tape server 2.

This ends the operation for applying the protective tape T1 to the surface of the wafer W in the first tape applying apparatus.

The wafer W, with the protective tape T1 applied to the surface thereof in the first tape applying apparatus, is transferred to the second tape applying apparatus.

In the second tape applying apparatus, the wafer W is positionally adjusted on the chuck table, and then the same operation as in the above first tape applying apparatus is repeated to apply the second protective tape T3 over the first protective tape T1.

In time of this tape application, the roller 9 rolls while pressing the surface of the second protective tape. The adhesive of the second protective tape T3 thereby enters and adheres fast to bulges and dimples of the substrate surface of the first protective tape T1 to enlarge an area of adhesion.

Figure 5:
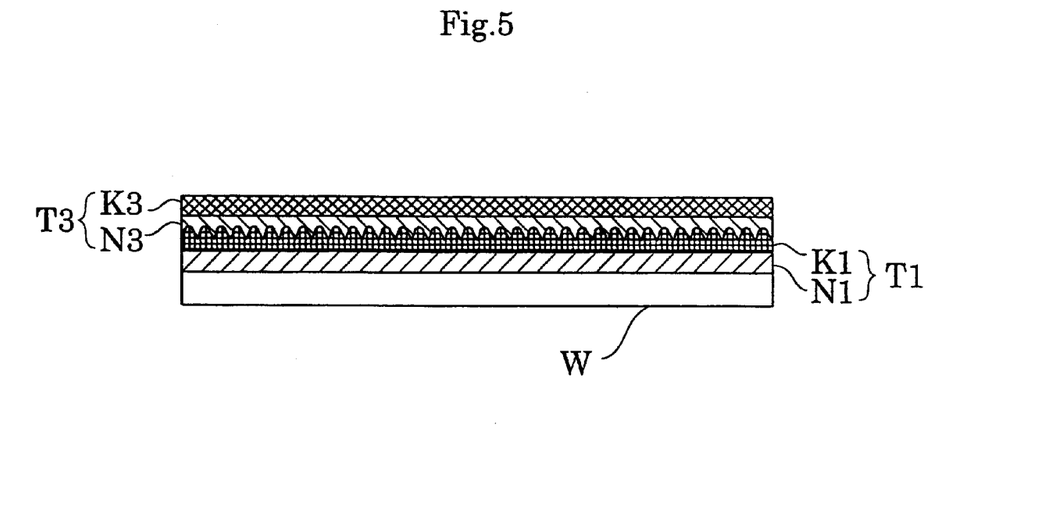
FIG. 5 is a view in vertical section of a wafer with protective tape applied in a plurality of plies thereto.

As a result, as shown in FIG. 5, the adhesive N3 of the protective tape T3 is in tight contact with the bulges and dimples of the surface of substrate K1 of protective tape T1. Thus, the wafer W has rigidity with the protective tapes T1 and T3 applied in a plurality of plies-thereto.

Wafers W with the two protective tapes applied in a plurality of plies thereto are transported in a cassette to a wafer mounting apparatus, for example. When the cassette is loaded into the wafer mounting apparatus, for example, the wafers W are taken out of the cassette, one at a time, and transferred to an alignment stage by a robot arm.

Figure 6:
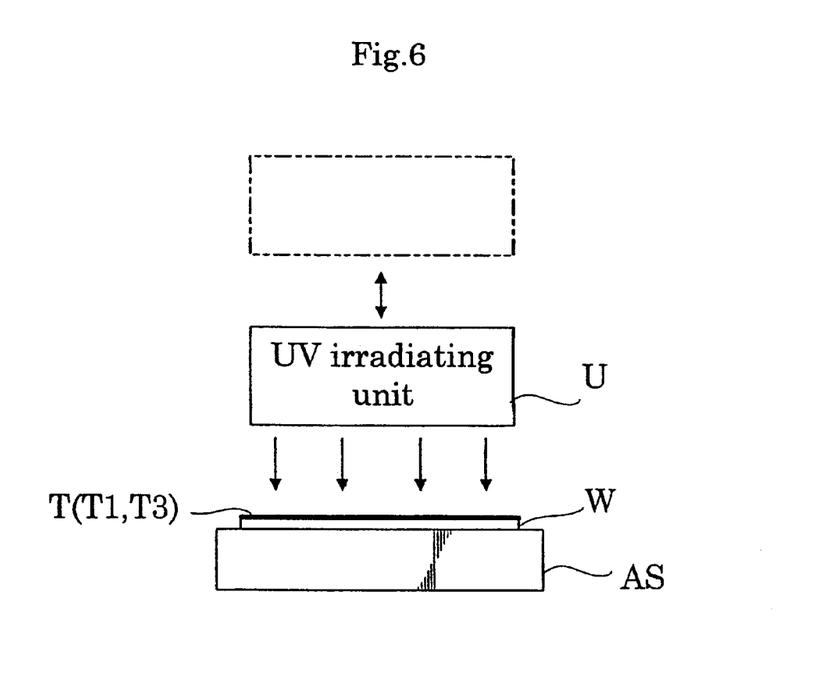
FIG. 6 is an explanatory view of an operation to irradiate the wafer with ultraviolet light.

Each wafer W transferred to the alignment stage is aligned based on an orientation flat or the like. After the alignment, as shown in FIG. 6, an ultraviolet irradiating unit U descends from a standby position above the alignment stage AS and emits ultraviolet light toward the wafer W.

The ultraviolet irradiation cures the adhesive of protective tape T3, and by its anchoring effect the protective tape T3 bonds firmly to the surface of the first protective tape T1. That is, the protective tapes T1 and T3 bond together with increased strength.

Figure 7:
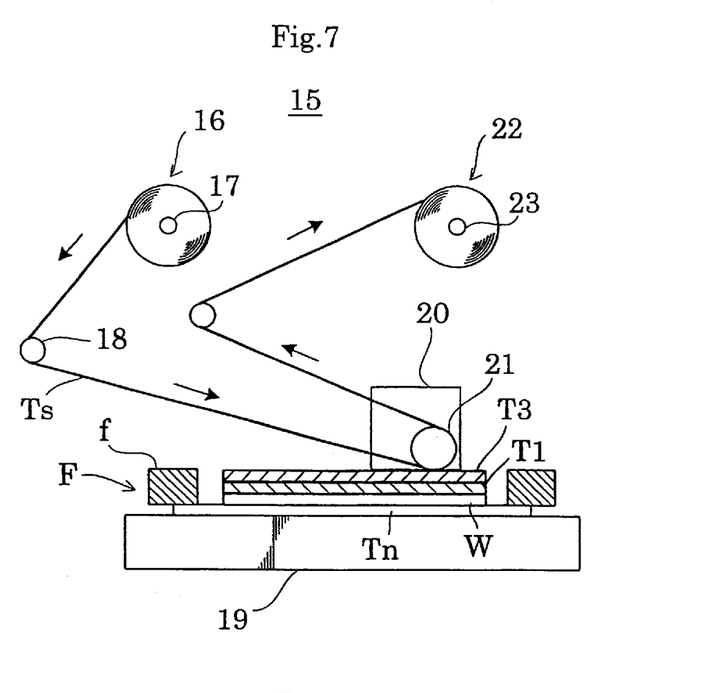
FIG. 7 is a front view showing an outline of a tape separating apparatus.

The wafer W having undergone the ultraviolet irradiating process is transported to a mount frame preparing unit, to be supported in a state when the wafer W is placed for a separating step shown in FIG. 7, i.e. by a ring-shaped frame f by means of adhesive tape Tn applied to the back surface. The wafer W supported by the ring-shaped frame f (hereinafter simply called "mount frame F") is transported to the separating step and is placed on a chuck table 19 of FIG. 7 to be described hereinafter.

As described above, the first protective tape T1 with the substrate having a rough surface is applied to the wafer W, and then the protective tape T3 of the ultraviolet curable type is applied. As a result, the adhesive of protective tape T3 enters bulges and dimples of the surface of substrate K1 of the protective tape T1 to enlarge an area of adhesion. Ultraviolet light emitted to the wafer W in this state cures the adhesive of protective tape T3 which, by its anchoring effect, bonds firmly to the first protective tape T1.

A protective tape separating method will be described next.

A protective tape separating apparatus for executing the protective tape separating method in this embodiment will be described first with reference to the drawings.

Figure 8:
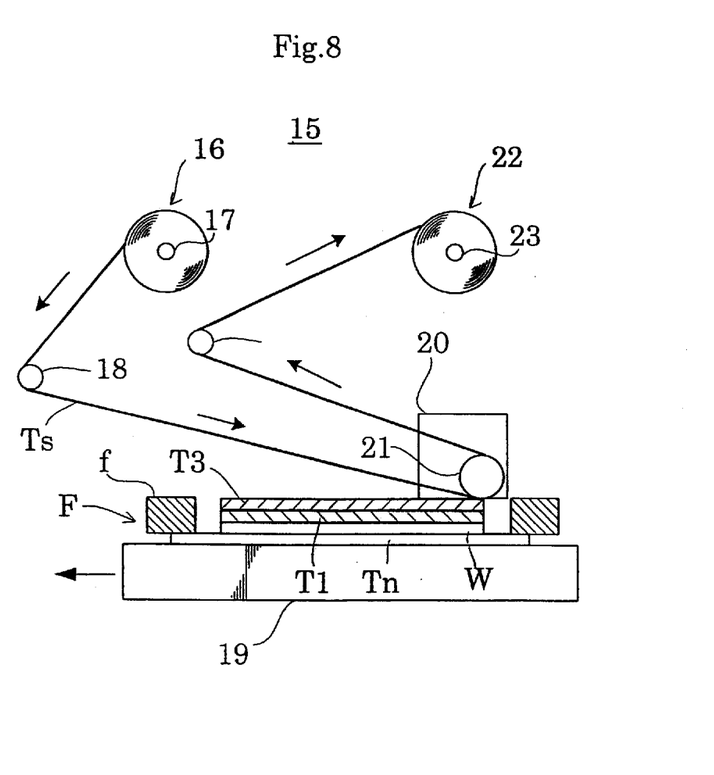
FIG. 8 is a schematic front view illustrating a tape separating process.
Figure 9:
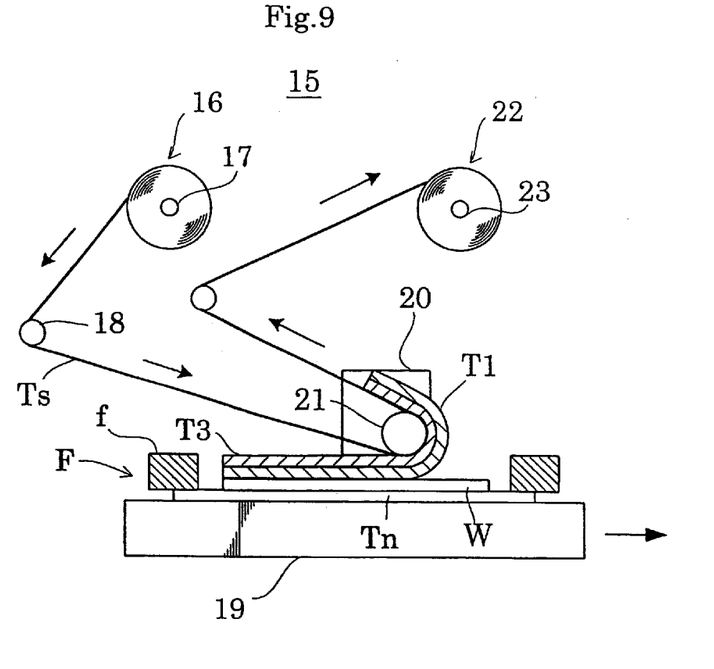
FIG. 9 is a schematic front view illustrating the tape separating process.
Figure 10:
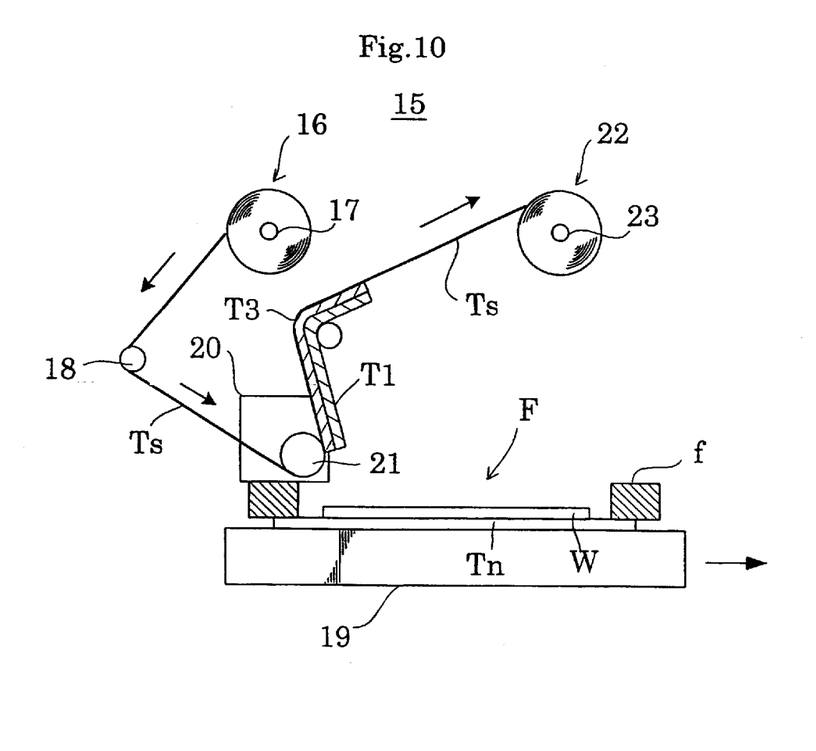
FIG. 10 is a schematic front view illustrating the tape separating process.

FIG. 7 is a front view showing an outline of the tape separating apparatus. FIGS. 8 through 10 are explanatory views illustrating a protective tape separating process.

An apparatus 15 for separating protective tape from semiconductor wafers, in this embodiment, has a tape server 16 for supplying a separating tape Ts, a chuck table 19 for suction-supporting a mount frame F, a separating mechanism 20 for pressing and applying the separating tape Ts to the protective tape T3 applied over the surface of the wafer W and separating the separating tape Ts together with the protective tape T3, and a tape collector 22 for collecting both tapes separated from the wafer W.

The construction of each mechanism will be described in detail hereinafter.

The tape server 16 guides the separating tape Ts drawn from a tape bobbin 17 to the separating mechanism 20 by way of a guide roller 18. The tape bobbin 17 is supported by a vertical wall not shown.

The chuck table 19 has guide pins for adjusting position of the mount frame F transferred thereto. The chuck table 19 is constructed to suck the back surface of the mount frame F. Further, the chuck table 19 has a frame thereof held by a rail of a main body of the apparatus and operatively connected to a driving device not shown, to be slidable in a running direction of the separating tape Ts.

The separating mechanism 20 has a separator roller 21 rotatably supported by a frame thereof and vertically swung by a cylinder or the like not shown. The separator roller 21 is operable to press and apply the separating tape Ts to the surface of the protective tape T3.

The tape collector 22 has a collecting bobbin 23 supported by the vertical wall not shown, and operatively connected to a driving device such as a motor not shown. That is, a predetermined quantity of separating tape Ts is drawn from the tape server 16 and fed onto the wafer W. The collecting bobbin 23 is driven by the driving device to wind up the separating tape Ts joined with the protective tape T3.

A method of separating the protective tape applied in a plurality of plies to the surface of each wafer will be described with reference to the drawings, using the tape separating apparatus having the above construction.

As shown in FIG. 8, for example, a semiconductor wafer W having applied thereto the first protective tape with the substrate having a rough surface and the second protective tape of the ultraviolet curable type, and the ring-shaped frame f, are joined at the back surfaces by the adhesive tape Tn to form the mount frame F. This mount frame F is placed on the chuck table 19.

The mount frame F placed is positionally adjusted and suction-supported. Then, as shown in FIG. 8, the chuck table 19 is moved (leftward in FIG. 8) to a position having the separator roller 21 in contact with a peripheral portion of the wafer W.

After the position of the mount frame F is adjusted, as shown in FIG. 9, the separator roller 21 is swung down and the chuck table 19 is moved in the running direction of the separating tape Ts. With the movement of the chuck table 19, the separator roller 21 rolls over the wafer W pressing the separating tape Ts thereon. That is, the separating tape Ts is applied to the uppermost protective tape T3, and the protective tape T3 with the separating tape Ts adhering thereto is taken up and separated together with the separating tape Ts.

At this time, the protective tape T1 is first separated from the surface of wafer W since the adhesion of protective tape T3 is stronger than the adhesion of protective tape T1. As a result, the two protective tapes T1 and T3 are separated together from the wafer W.

When the chuck table 19 reaches a terminal position as shown in FIG. 10, the separator roller 21 is moved upward and the chuck table 19 is moved counter to the tape running direction back to the initial position. In the meantime, the protective tape T3, which is joined and separated with the separating tape Ts, is wound up around the collecting bobbin 23, while a predetermined quantity of separating tape Ts is drawn from the tape server 16. This ends the operation for separating the uppermost one T3 of the protective tapes applied to the surface of the wafer W.

As described above, the protective tape applied in a plurality of plies on the surface of wafer W may be separated together in one separating operation.

<Second Embodiment>

This embodiment will be described by taking for example the case of applying, at a time, the two types of protective tape used in the above first embodiment (i.e. protective tape of the first non-ultraviolet curable type with a rough surface and the second ultraviolet curable type) by using one tape applying apparatus. Like reference numerals will be used to identify like parts which are the same as in the first embodiment, and different parts will be described.

Figure 11:
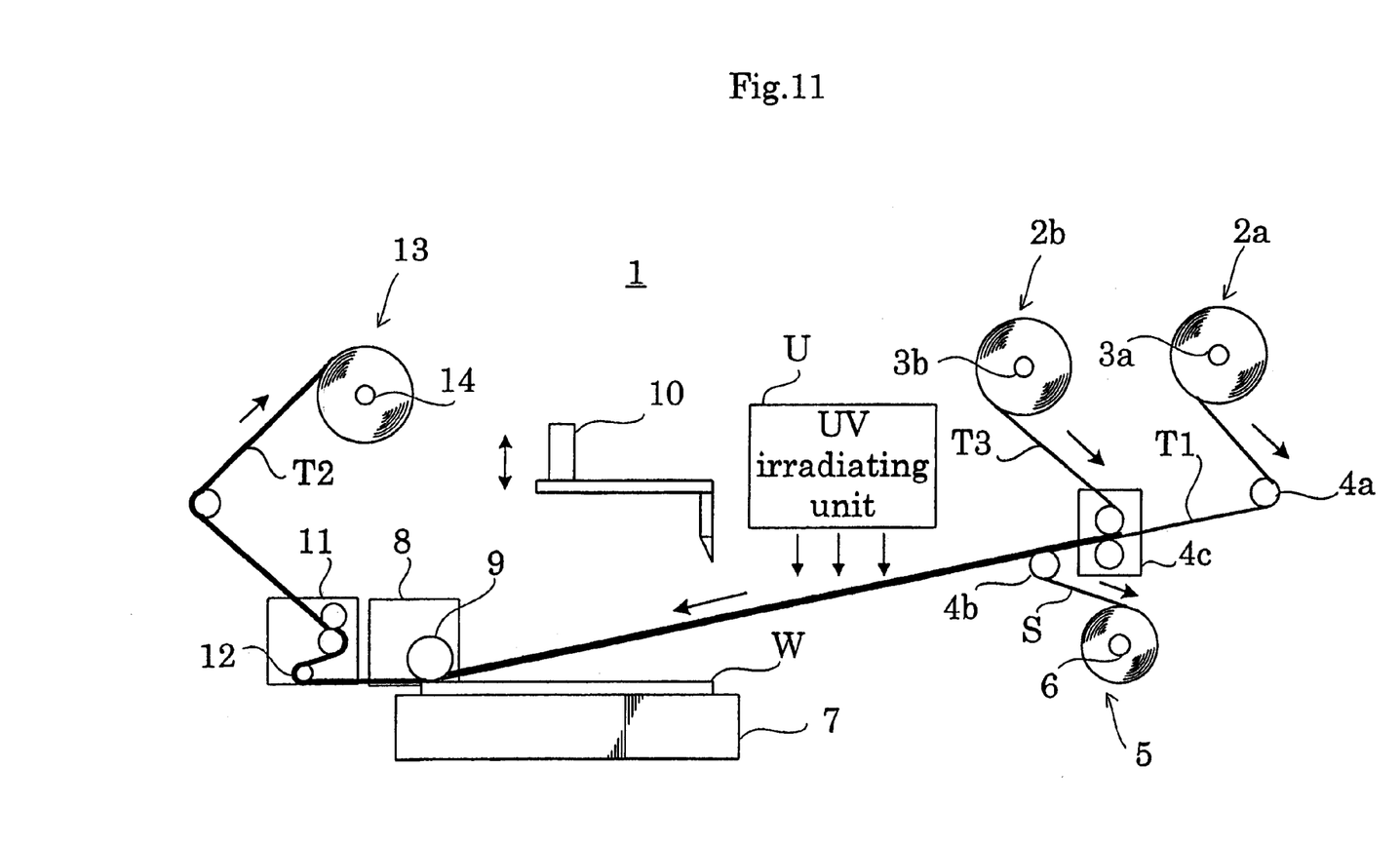
FIG. 11 is a front view showing an outline of a tape applying apparatus in a second embodiment.

As shown in FIG. 11, the apparatus 1 in this embodiment includes two tape servers 2a and 2b, an applying unit 4c for applying in a plurality of plies protective tapes T1 and T3 drawn from the tape servers 2a and 2b, and an ultraviolet irradiating unit U for emitting ultraviolet light in a process of feeding the protective tapes from the applying unit 4c over the wafer W.

The tape server 2a guides the protective tape T1 with a separator S drawn from a tape bobbin 3a to move around a guide roller 4a.

The tape server 2b guides the protective tape T3 without a separator drawn from a tape bobbin 3b to the applying unit 4c.

Each of the tape servers 2a and 2b is journalled on a vertical wall not shown, and is checked against rotation by a braking mechanism or the like.

The applying unit 4c has two, upper and lower rollers for pinching the two protective tapes drawn from the tape servers 2a and 2b, and pressing and applying the protective tape T2 to the protective tape T1.

The separator collector 5 is arranged to collect the separator S of protective tape T1 drawn from the applying unit 4c through a roller 4b.

The ultraviolet irradiating unit U emits ultraviolet light toward the protective tapes T1 and T3 in two plies drawn from the applying unit 4c, with the separator S separated and collected.

With the above construction, the two protective tapes drawn from tape servers 2a and 2b are bonded together before being fed over the wafer W. The protective tapes T1 and T3 in plies are applied to the surface of wafer W in one applying operation.

The protective tapes T1 and T3 applied in plies to the wafer W are separated together from the surface of wafer W in one separating operation in the separating step.

In this embodiment, therefore, the two protective tapes are applied to the wafer W by using only one tape applying apparatus, to realize improved operating efficiency.

In this embodiment, the protective tape of the ultraviolet curable type is used as the second protective tape, but a protective tape of the non-ultraviolet curable type-may be used. In this case, the ultraviolet irradiating unit U may be omitted.

This invention is not limited to the foregoing embodiments, but may be modified as follows:

(1) In the above protective-tape applying methods, the protective tapes in sheet form are fed from stock rolls, and applied in plies while cutting out along the peripheries of wafer W. The tapes may be cut to the shape of wafer in advance, and repeatedly applied individually. The tapes may be superimposed together before application.

(2) The above protective tape applying methods use the first protective tape of the non-ultraviolet curable type with a rough substrate surface, and the second protective tape of the ultraviolet curable type. The protective tapes may be used in the following combinations.

A combination of the first protective tape of the non-ultraviolet curable type with a rough substrate surface, and a second protective tape of the non-ultraviolet curable type; a combination of a first protective tape of the ultraviolet curable type with a rough substrate surface, and a second protective tape of the ultraviolet curable type with an ordinary substrate surface given back surface treatment; a combination of protective tapes of the ordinary non-ultraviolet curable type or of protective tapes of the ordinary ultraviolet curable type; or a combination of a plurality of protective tapes of the same type or different types.

(3) In the above protective tape separating method, the chuck table 19 is movable in the tape running direction. Instead, the separating mechanism 20 itself may be adapted movable in the tape running direction.

(4) The above protective tape separating method has been described by taking the mount separation for example. The mount separation is not limitative. Protective tapes applied in plies to the surface of a wafer not supported by a mount frame may be separated.

This invention may be embodied in other specific forms without departing from the spirit or essential attributes thereof and, accordingly, reference should be made to the appended claims, rather than to the foregoing specification, as indicating the scope of the invention.

What is claimed is:

1. A protective tape applying and separating method for applying protective tapes to a surface of a semiconductor wafer with a pattern formed thereon, and separating the protective tapes from the surface of the semiconductor wafer, said method comprising:

an applying step for applying a plurality of protective tapes in plies to the surface of said semiconductor wafer such that a protective tape with strong adhesion lies on top; and a separating step for applying a separator tape over said protective tapes applied in plies, and separating all at a time the protective tapes in plies from the surface of said semiconductor wafer by means of the separator tape.

2. A protective tape applying and separating method as defined in claim 1, wherein said protective tapes applied to the surface of the semiconductor wafer comprise two protective tapes bonded together in plies as a unit beforehand.

3. A protective tape applying and separating method as defined in claim 2 wherein at least an upper one of said protective tapes applied in plies is an ultraviolet curable protective tape.

4. A protective tape applying and separating method as defined in claim 3, wherein ultraviolet light is emitted to the protective tapes applied in plies to the surface of said semiconductor wafer.

5. A protective tape applying and separating method as defined in claim 2, wherein a lower one of said protective tapes applied in plies is an ultraviolet curable protective tape, and ultraviolet light is emitted before the protective tapes are separated from said semiconductor wafer.

6. A protective tape applying and separating method as defined in claim 2, wherein an upper one of said protective tapes applied in plies is a non-ultraviolet curable protective tape.

7. A protective tape applying and separating method as defined in claim 2, wherein a lower one of said protective tapes applied in plies is a non-ultraviolet curable protective tape.

8. A protective tape applying and separating method as defined in claim 2, wherein a lower protective tape of the protective tapes applied in plies has a rough surface.

9. A protective tape applying and separating method as defined in claim 1, wherein said protective tapes in plies are repeatedly applied as two separate protective tapes.

10. A protective tape applying and separating method as defined in claim 9 wherein at least an upper one of said protective tapes applied in plies is an ultraviolet curable protective tape.

11. A protective tape applying and separating method as defined in claim 10, wherein ultraviolet light is emitted to the protective tapes applied in plies to the surface of said semiconductor wafer.

12. A protective tape applying and separating method as defined in claim 10, wherein the protective tapes in plies are bonded together and ultraviolet light is emitted in a feeding step preceding application of the protective tapes to the surface of said semiconductor wafer.

13. A protective tape applying and separating method as defined in claim 9, wherein a lower one of said protective tapes applied in plies is an ultraviolet curable protective tape, and ultraviolet light is emitted before the protective tapes are separated from said semiconductor wafer.

14. A protective tape applying and separating method as defined in claim 9, wherein an upper one of said protective tapes applied in plies is a non-ultraviolet curable protective tape.

15. A protective tape applying and separating method as defined in claim 9, wherein a lower one of said protective tapes applied in plies is a non-ultraviolet curable protective tape.

16. A protective tape applying and separating method as defined in claim 9, wherein a lower protective tape of the protective tapes applied in plies has a rough surface.

* * * * *